United States Patent [19]

Disney et al.

[11] Patent Number: 5,723,916
[45] Date of Patent: Mar. 3, 1998

[54] ELECTRICAL LOAD DRIVING DEVICE INCLUDING LOAD CURRENT LIMITING CIRCUITRY

[75] Inventors: Donald Ray Disney; John Robert Shreve, both of Kokomo, Ind.

[73] Assignee: Delco Electronics Corporation, Kokomo, Ind.

[21] Appl. No.: 650,148

[22] Filed: May 17, 1996

[51] Int. Cl.[6] ..................................... H01H 9/30
[52] U.S. Cl. .................. 307/131; 307/9.1; 307/10.1; 307/10.6; 123/630; 361/118; 361/247; 327/314
[58] Field of Search ........................... 307/9.1, 10.1, 307/10.6, 10.7, 10.8; 123/630, 644; 361/118, 56, 247, 253, 263, 13; 327/310, 314, 325, 432

[56] References Cited

U.S. PATENT DOCUMENTS

| | | | |
|---|---|---|---|
| 4,323,792 | 4/1982 | Bergmann et al. | 327/314 |
| 4,384,287 | 5/1983 | Sakuma | 340/771 |
| 4,451,778 | 5/1984 | Fischer et al. | 323/282 |
| 4,580,063 | 4/1986 | Torelli et al. | 307/200 B |
| 4,860,152 | 8/1989 | Osborn | 361/91 |
| 5,001,373 | 3/1991 | Bator et al. | 327/314 |
| 5,055,721 | 10/1991 | Majumdar et al. | 307/570 |
| 5,136,349 | 8/1992 | Yilmaz et al. | 357/23.4 |
| 5,200,878 | 4/1993 | Sasagawa et al. | 361/93 |
| 5,397,978 | 3/1995 | Parry et al. | 361/93 |
| 5,432,471 | 7/1995 | Majumdar et al. | 323/280 |
| 5,444,591 | 8/1995 | Chokhawala et al. | 361/18 |
| 5,466,952 | 11/1995 | Moody | 257/139 |
| 5,536,988 | 7/1996 | Kawate | 307/116 |
| 5,576,648 | 11/1996 | Rossi | 327/110 |
| 5,581,131 | 12/1996 | Urushiwara | 307/10.6 |
| 5,581,432 | 12/1996 | Wellnitz | 361/56 |

Primary Examiner—William M. Shoop, Jr.
Assistant Examiner—Peter Ganjian
Attorney, Agent, or Firm—Jimmy L. Funke

[57] ABSTRACT

An insulated gate electrical load driving device includes simple and accurate gate control circuitry for limiting load current therethrough. Preferably, all circuitry is formed of a single integrated circuit having the insulated gate load driving device dielectrically isolated from the gate control circuitry. The gate control circuitry may include either one, or both, of a zener diode and a resistor divider. An input drive signal to the circuit is accurately controlled by the gate control circuitry to thereby limit the saturation current through the insulated load driving device, and hence the load current, to predetermined current level. Preferably, the predetermined saturation current level falls within a range of saturation currents of the insulated gate load driving device that is substantially constant over a wide operating temperature range.

17 Claims, 6 Drawing Sheets

ELECTRICAL LOAD DRIVING DEVICE INCLUDING LOAD CURRENT LIMITING CIRCUITRY

FIELD OF THE INVENTION

The present invention relates generally to circuitry for limiting current through an insulated gate transistor, and more specifically to the combination of such circuitry and the insulated gate transistor forming a single monolithic electrical load driving circuit.

BACKGROUND OF THE INVENTION

Circuitry for limiting load current in an electrical load driving arrangement is known and is prevalent in the design of discrete, so-called hybrid, and integrated circuitry. Typically, although not exclusively, such a circuitry is used in inductive load driving applications. Such applications are a common place in, for example, automotive ignition systems, fuel injection systems, and the like.

Although known Darlington transistors are often used as the load driver in automotive ignition systems, other such ignition systems utilize an insulated gate power transistor. An example of one such transistor is a MOS-variant known as an insulated gate bipolar transistor (IGBT). The use of IGBT's in automotive ignition systems have gained popularity over Darlington and other predecessor transistor arrangements because they offer better efficiency, simplified drive requirements, and built-in reverse battery protection.

In the past, electronic ignition control systems have typically been fabricated using known circuit board or so-called hybrid microelectronics technology. Increasing restrictions on available physical space, along with the industry-wide goal of increasing reliability of such systems, have spawned a new generation of so-called "all-silicon" ignition control systems. An example of one known all-silicon ignition control system is formed of a single, high-voltage integrated circuit that includes a Darlington driver and associated system control circuitry. An example of another known all-silicon ignition control system includes separate driver (IGBT or Darlington) and control integrated circuits packaged together in a single module. Details of one such ignition control module are given in U.S. patent application Ser. No. 08/550,317 entitled "Coil Current Limiting Feature For An Ignition Coil Driver Module," filed by John R. Shreve et al., which is assigned to the assignee of the present invention.

An example of yet another known all-silicon ignition control system is a single integrated circuit including a pair of IGBT's and associated gate control circuitry. One such system 10 is shown in FIG. 1. Referring to FIG. 1, system 10 includes ignition control circuitry 12, which is typically a control module of the automotive system. Ignition control circuitry 12 receives battery voltage $V_{BATT}$ 14 from a battery (not shown), and connects $V_{BATT}$ to the primary coil 18 of an ignition coil via VIGN 16 line. The opposite end of primary coil 18 is connected to the collector 28 of IGBT 20. For ease of illustration, the "pair" of IGBT's of system 10 is shown in FIG. 1 as comprising a single IGBT 20 having a pair of emitters extending therefrom, although it is understood that IGBT 20 may be provided as a discrete pair of IGBT's having their collectors connected together, and often times having a resistor disposed between the respective gates thereof.

IGBT 20 further includes a first emitter 22 connected to ground potential and a second emitter 24 connected to one end of a resistor $R_S$ 30, the other end of which is connected

2 to ground potential. The gate 26 of IGBT 20 is connected to a gate drive output 34 of ignition control circuitry 12. Gate control circuitry, represented in FIG. 1 as generic block 32, is typically connected between gate 26 and emitter 24. Emitter 24 is typically sized to be a small fraction of the area of emitter 22. Thus, only a small fraction of the coil load current $I_L$ flows through resistor $R_S$ 30.

In operation, coil primary 18 is energized by providing a sufficient gate drive voltage at output 34 of ignition control circuitry 12 to turn on transistor 20 to full conduction. As the coil current $I_L$ begins to increase, so does the voltage drop across resistor $R_S$ 30. Gate control circuitry 32 and resistor $R_S$ 30 are typically designed so that when coil current $I_L$ reaches a desired current level, the corresponding voltage drop across $R_S$ 30 causes gate control circuitry 32 to maintain the voltage at gate 26 at a gate voltage level required to maintain the desired current level $I_L$ flowing through coil primary 18 and IGBT 20.

Known gate control circuits 32 typically include a MOS-transistor having its gate connected to emitter 24 and its drain connected to gate 26 of IGBT 20. Thus, when the voltage drop across $R_S$ 30 increases to a sufficient level, the MOS-transistor is activated to control the voltage at gate 26 of IGBT 20. In addition to the MOS-transistor, gate control circuitry 32 may include various combinations of resistors and diodes designed to maintain the voltage at gate 24 at a desired level during the current limiting function.

The system control circuitry of the above-described all-silicon ignition control systems, as well as gate control circuitry 32 of FIG. 1, is primarily used to limit the collector current of the drive transistor to a safe level to thereby protect the drive transistor and the ignition coil. In doing so, the foregoing systems require elaborate on-chip control features which often require complex manufacturing processes, and which also significantly increase the cost of such a system, both monetarily and in device size. What is therefore needed is an all-silicon ignition control system comprising a single integrated circuit which includes a single load drive transistor and simple circuitry for performing the current limit function.

Preferably, such circuitry should be easily fabricated and consume minimal circuit real estate.

SUMMARY OF THE INVENTION

The present invention addresses the foregoing shortcomings of known ignition control systems by providing a simple monolithic electrical load driving circuit having a current limiting feature. In accordance with one aspect of the invention, an automotive ignition control system includes a monolithic ignition coil driving circuit defining a single insulated-gate load driving transistor and simple gate control circuitry. In one embodiment, a single zener diode is connected between the gate and emitter of a load driving IGBT, wherein the zener breakdown voltage is designed to correspond to the gate voltage required to limit the load current $I_L$ through the IGBT to a desired saturation current value. In another embodiment, a first resistor is connected in series between the gate of the IGBT and the gate drive signal, and a second resistor is connected between the gate and emitter of the IGBT. If the maximum amplitude of the gate drive signal is sufficiently low and repetitive, the present embodiment may be used to control the gate voltage in the same manner as described in the previous embodiment. In yet another embodiment, first and second resistors are connected to an IGBT as previously described, and a zener diode is connected between the incoming gate drive signal and the emitter of the IGBT. In this embodiment, the zener diode clamps the incoming gate drive signal at a known level, and the resistor divider circuit reduces the clamped voltage to provide a desired gate drive voltage operable to drive the IGBT as previously described.

Each of the foregoing embodiments may include an over-voltage clamp connected between the gate and collector of an IGBT, wherein the gate of the IGBT may be provided from the monolithic circuit as a monitoring terminal for over-voltage fault detection. When an over-voltage fault occurs due to the known "inductive flyback" phenomenon, the voltage at the gate of the IGBT will be higher than the gate drive voltage input to the circuit. Monitoring the gate drive input as well as the gate of the IGBT thus permits detection of an over-voltage fault condition.

In yet another embodiment of the present invention, the zener diode and second resistor are connected together and provided as a floatable terminal rather than being connected to the emitter of the IGBT. The floatable terminal may be connected to the emitter of the IGBT to operate as described above, or can remain unconnected to permit operation of the circuit with lower input gate drive voltages.

In still another embodiment of the present invention, the second resistor may be fabricated as a network of resistors that can be subsequently programed. Such a feature permits adjustment of the value of the second resistor to thereby compensate for processing variations.

In accordance with another aspect of the present invention, an insulated gate transistor is preferably used as the load driving device since such transistors typically have a range of saturation currents that are substantially temperature independent. The concepts of the present invention are thus particularly well suited for automotive applications in that the current limiting feature of the invention described herein can be designed to be relatively consistent over a wide operating temperature range.

In accordance with yet another aspect of the present invention, the insulated gate load driving transistor and the associated gate control circuitry are formed of a single integrated circuit. Advantageously, the insulated gate load driving transistor is dielectrically isolated from the gate control circuitry to minimize any parasitic electrical interactions therebetween.

One object of the present invention is to provide a simplified electrical load driving circuit having a load current limiting feature.

Another object of the present invention is to provide such a load driving circuit having the flexibility to accept a wide range of input gate drive voltages while maintaining a desireable current limiting level.

Yet another object of the present invention is to provide an electrical load driving device having a current limiting feature which limits load current to a relatively constant value over a wide operating temperature range.

Still another object of the present invention is to provide an electrical load driving integrated circuit having an insulated gate load driving device dielectrically isolated from associated gate control circuitry.

These and other objects of the present invention will become more apparent from the following description of the preferred embodiment.

DESCRIPTION OF THE PREFERRED EMBODIMENT

Figure 1:
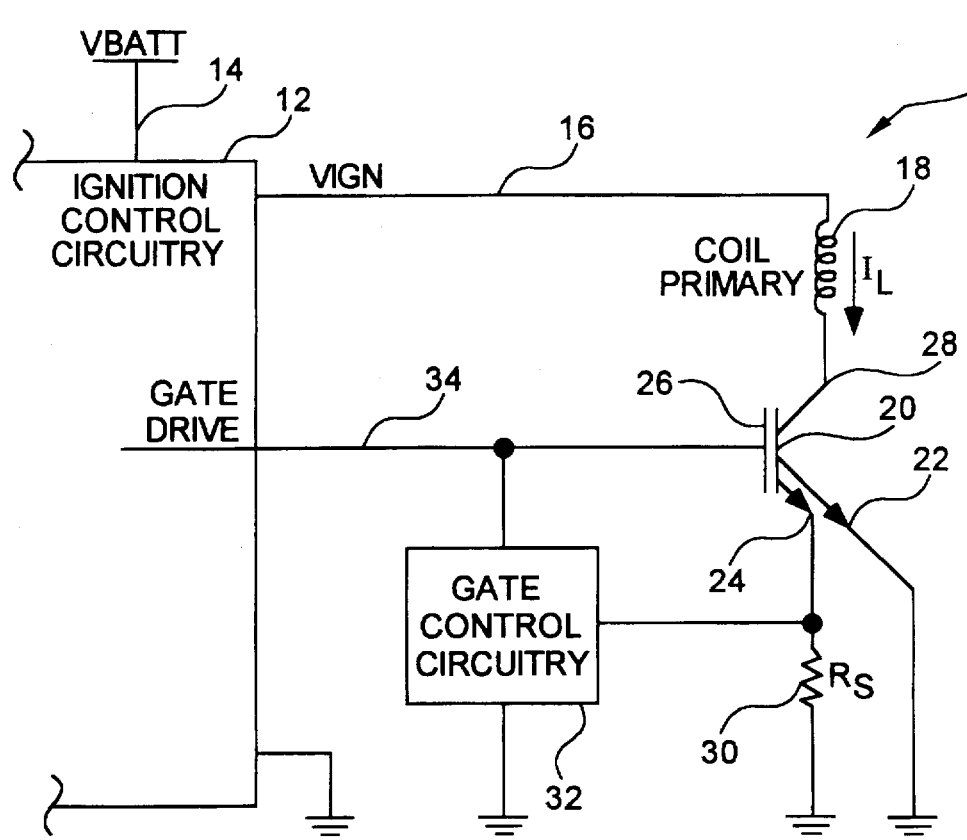
FIG. 1 is a schematic diagram illustrating a known automotive ignition control system.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

Figure 2:
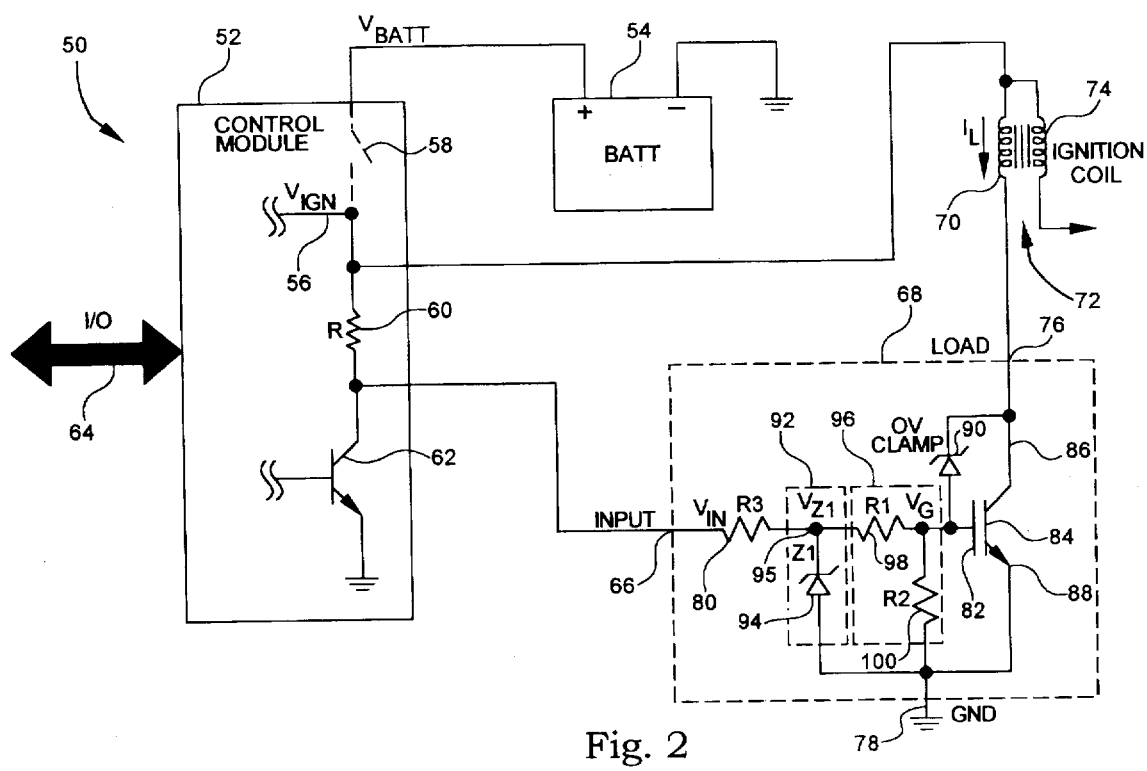
FIG. 2 is a schematic diagram showing an electrical load driving device having a current limiting feature, in accordance with one embodiment of the present invention.

Referring now to FIG. 2, a typical ignition control system 50 is shown incorporating one preferred embodiment of an electrical load driving circuit 68 of the present invention therein. Central to ignition control system 50 is a control module 52 which is configured to provide appropriate ignition coil timing signals therefrom. In the automotive industry, control module 52 is typically a so-called engine control module (ECM) or power-train control module (PCM). Such a control module 52 is typically a microprocessor-controlled module including read-only-memory (ROM) and random-access-memory (RAM) for storing data and software algorithms executable by the microprocessor (not shown). Control module 52 further typically includes a plurality of input and output (I/O) 64 connections for interfacing with various operational and diagnostic signals.

Control module 52 is powered by battery 54 which provides a battery voltage $V_{BATT}$ of between approximately 7.0 volts and 24 volts, with typical $V_{BATT}$ voltages being in the range of approximately 12–16 volts.

As shown in FIG. 2, battery voltage $V_{BATT}$ is connected to a switch 58 which is, in turn, connected to a signal line labeled $V_{IGN}$ 56. Although shown as a physical switch within control module 52, switch 58 preferably represents a portion of a vehicle ignition switch operable via an ignition key. Ignition key switch (not shown) typically has an "off" position, an "on" position and a "crank" position. When the ignition key is switched from the "off" position to either the "crank" or the "on" position (hereinafter referred to as an "ignition signal") switch 58 connects the voltage $V_{BATT}$ to the $V_{IGN}$ 56 line. $V_{IGN}$ line 56 is connected to one end of the primary 70 and secondary 74 coils of an automotive ignition coil 72, and to one end of a pull-up resistor R 60. The other end of resistor R 60 is connected to the collector of transistor 62 and to INPUT 66 of electrical load driving circuit 68. The emitter of transistor 62 is referenced at ground potential, and the base of transistor 62 is driven by appropriate circuitry within control module 52 (not shown). LOAD 76 of electrical load driving circuit 68 is connected to the remaining end of the primary coil 70 of the ignition coil 72, and GND 78 is referenced at ground potential.

Referring specifically to electrical load driving circuit 68, INPUT 66 is connected to one end of a resistor $R_3$ 80, the opposite end of which is connected to one end of a zener diode $Z_1$ 94 and to one end of a resistor $R_1$ 98. The common connection of $R_3$ 80, $Z_1$ 94 and $R_1$ 98 defines a circuit node 95. The voltage at node 95 (to be discussed hereinafter) is defined as $V_{Z1}$. The opposite end of $R_1$ 98 is connected to one end of a resistor $R_2$ 100, a gate 82 of insulated gate transistor 84, and to one end of an over-voltage (OV) clamp 90. The voltage at gate 82 of transistor 84 is defined as $V_G$. The remaining ends of $Z_1$ 94 and $R_2$ 100 are connected to GND 78.

Preferably, insulated gate transistor 84 is a known metal-oxide-semiconductor field effect transistor (MOSFET) variant known in the semiconductor industry as an insulated gate bipolar transistor (IGBT). However, the present invention contemplates that transistor 84 may be any insulated gate transistor. IGBT 84 includes a collector 86 connected to the remaining end of OV clamp 90, and to LOAD 76. An emitter 88 of IGBT 84 is connected to GND 78. IGBT 84 may be turned on to full conduction with the application of a small current at its gate 82 to thereby charge its gate capacitance to approximately 2–4 volts. Typically, this small input current is within the range of between approximately 200 micro amperes to approximately 3.0 milliamperes. Apart from the low current drive requirements of IGBT 84, use of such a device in the typical ignition control system 50 of FIG. 2 has gained popularity for at least two additional reasons. First, the reverse breakdown voltage between emitter 88 and collector 86 is typically much higher than automotive battery voltages $V_{BATT}$, which thereby effectively blocks potentially high current flow through the primary coil 70 of ignition coil 72 under a reverse battery condition. Secondly, IGBT 84 is generally not susceptible to thermal run away characteristics associated with known bipolar junction transistors (BJT's) generally, and with Darlington-connected BJT's specifically.

Preferably, transistor 84 should be capable of operating at load currents $I_L$ of up to approximately 0.5–20 amperes. Although the load may typically be the primary coil 70 of an automotive ignition coil 72 as shown in FIG. 2, it is to be understood that the present invention contemplates utilizing the concepts described herein to provide load drive capability to a wide variety of reactive loads. As one example of such a load, fuel injectors for internal combustion engines are typically inductive loads requiring load currents in the range of approximately 0.5–10 amperes. Other such inductive, resistive, or capacitive load driving applications will become apparent to those skilled in the integrated circuit and electronic system design arts.

Electrical load driving circuit 68, as it relates to the present invention, can best be described by partitioning the electrical components shown therein into three circuit blocks. A first circuit block includes resistor $R_3$ 80, OV clamp 90, and insulated gate transistor 84. A second circuit block includes zener diode $Z_1$ 94, which is graphically highlighted by dashed-line box 92. The third circuit block includes resistors $R_1$ 98 and $R_2$ 100, which is graphically highlighted by dashed-line box 96. As will be more fully described hereinafter, electrical load driving circuit 68 may include either one, or both, of circuit blocks 92 and 96.

Referring to the first aforementioned circuit block, one important reason for the inclusion of OV clamp 90 and resistor $R_3$ 80 therein will now be described. When driving inductive loads with a circuit configuration of the type shown in FIG. 2, a phenomenon known as "inductive flyback" is known to occur. Essentially, this phenomenon occurs when high current flow has been established through primary coil 70 and insulated gate transistor 84, and the drive signal to gate 82 is thereafter removed. Since current decay through an inductive load generally lags behind the switching speed of transistor 84, a subsequent inductive "flyback" effect creates a high voltage at collector 86 which may exceed the breakdown voltage of the transistor 84 junctions located between collector 86 and emitter 88. The combination of this high voltage and full load current creates a potentially destructive condition for transistor 84. To guard against such potential damage, it is known to provide an OV clamp 90, typically comprising a number of series-connected zener diodes, between the collector 86 and gate 82 of transistor 84. The OV clamp 90 is designed to have an avalanche breakdown voltage that is less than the minimum avalanche breakdown voltage of the transistor 84 junctions located between collector 86 and emitter 88. In operation, if the high voltage at collector 86 created by the "flyback" effect exceeds the avalanche breakdown voltage of OV clamp 90, current will flow therethrough to the gate 82 and thereby turn transistor 84 back on. In this manner, the voltage at collector 86 is actively clamped at a maximum voltage approximately equal to the avalanche breakdown voltage of OV clamp 90.

For the OV clamp 90 to function properly, electrical load driving circuit 68 must include some resistance in series with the gate of transistor 84 to insure effective charging of the gate capacitance so that transistor 84 can turn on in an inductive flyback condition. Thus, resistor $R_3$ 80 and OV clamp 90 are included within electrical load driving circuit 68, as is known on the art, to protect transistor 84 from inductive flyback.

In accordance with the present invention, either one, or both, of circuit blocks 92 and 96 may be included within electrical load driving device 68 to cause transistor 84 to operate in a manner described hereinafter. With both circuit blocks 92 and 96 included, electrical load driving device 68 may operate in a first mode such that the gate voltage $V_G$ is independent of input drive voltage $V_{IN}$ for $V_{IN}$ voltages above $V_{Z1}$. In the first mode of operation, the gate voltage $V_G$ is given by the equation:

$$V_G = (V_{Z1} * R_2)/(R_1 + R_2) \quad (1).$$

In a second mode of operation of electrical load circuit 68, circuit block 92 is omitted therefrom, and the gate voltage $V_G$ is given by the equation:

$$V_G = (V_{IN} * R_2)/(R_1 + R_2 + R_3) \quad (2)$$

Finally, in a third mode of operation, circuit block 96 is omitted therefrom so that the gate voltage $V_G$ is given by the equation:

$$V_G = V_{Z1} \quad (3)$$

Figure 3:
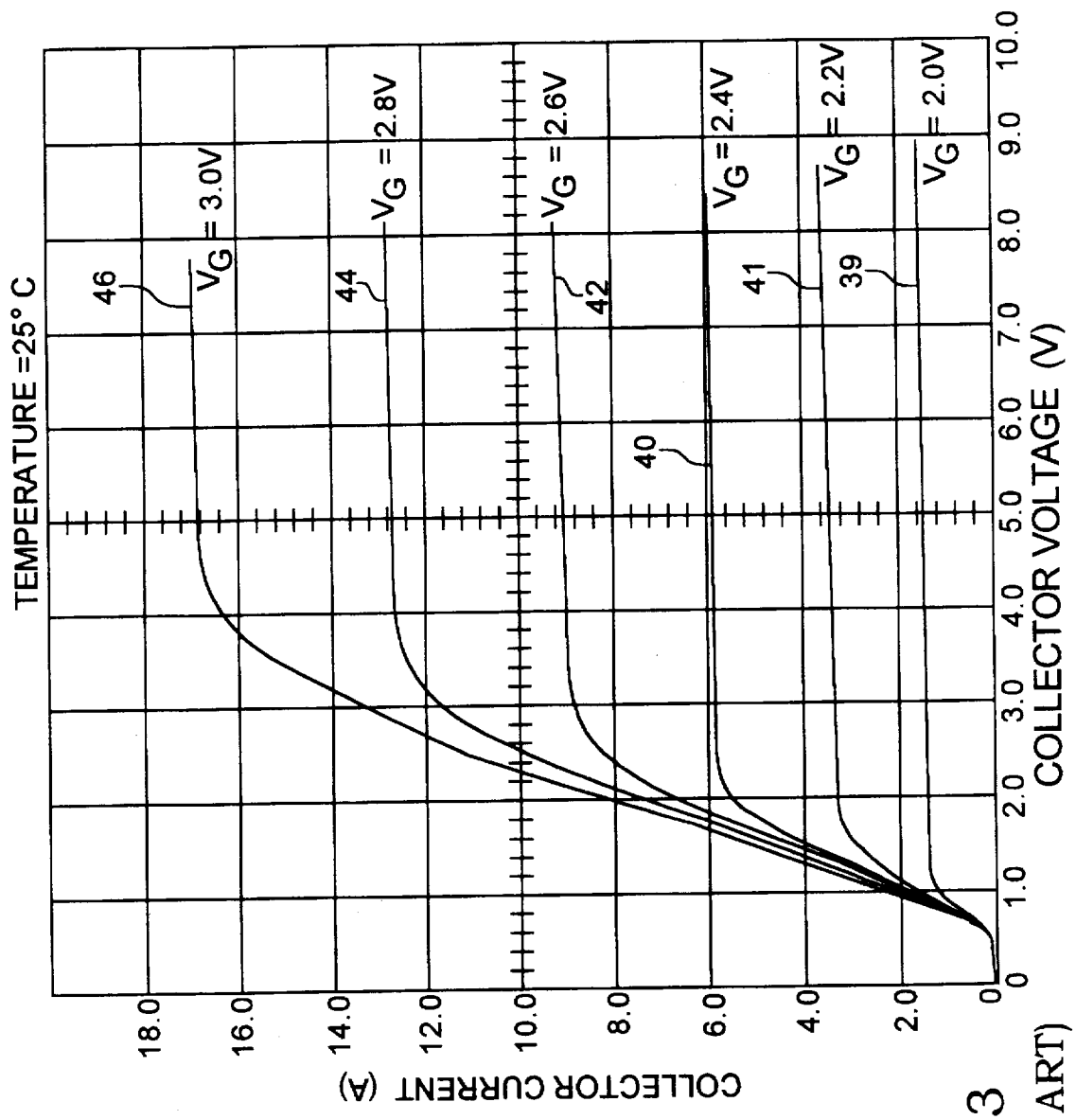
FIG. 3 is a plot of known IGBT collector current versus IGBT collector voltage at 25° C. for a number of different gate drive voltages.

Inherent in the operation of an insulated gate transistor, such as IGBT 84, saturation currents flowing therethrough are known to be relatively constant for any given gate voltage. FIG. 3 illustrates this known relationship for IGBT 84. Referring to FIG. 3, IGBT 84 collector current is shown plotted versus collector voltage, for a number of different gate voltages, at 25° C. For $V_G$=2.0 volts, collector current ($I_C$) 39 saturates at approximately 1.5 A, for $V_G$=2.2 volts, $I_C41$ saturates at approximately 3.2 A, for $V_G$=2.4 volts, $I_C40$ saturates at approximately 6.0 A, for $V_G$=2.6 volts, $I_C42$ saturates at approximately 9.0 A, for $V_G$=2.8 volts, $I_C44$ saturates at approximately 12.7 A, and for $V_G$=3.0 volts, $I_C46$ saturates at approximately 16.8 A. In accordance with the present invention, an accurate current limit for transistor 84 is achieved by accurately controlling the gate voltage $V_G$ of transistor 84 to cause the collector current to remain relatively constant as illustrated in FIG. 3. Thus, a desired current limit level for load current $I_L$ is established in the present invention by simply, but accurately, controlling the gate voltage $V_G$.

The first and third modes of operation of electrical load driving circuit 68 are intended for applications in which the maximum amplitude of input voltage $V_{IN}$ is either unknown or excessively high. In either case, zener diode $Z_1$ 94 provides a reference voltage $V_{Z1}$ that is independent of the magnitude of input voltage $V_{IN}$ for $V_{IN}$ values in excess of $V_{Z1}$. Circuit block 92 thus claps the input voltage $V_{IN}$ at a known maximum value. In certain applications, a zener diode $Z_1$ 94 can be provided wherein the voltage $V_{Z1}$ is equal to the gate voltage $V_G$ required to limit the load current $I_L$ to the desired saturation current level. In such a case, circuit block in 96 is not required, and may therefore be omitted from circuit 68. Circuit 68 will then operate in the third mode and the gate voltage $V_G$ defining the saturation current through transistor 84 which corresponds to the limited level of load current $I_L$ therethrough, is then given by equation (3). In other applications, the gate voltage $V_G$ required to limit the load current $I_L$ to the desired saturation current level is less than $V_{Z1}$. In such a case, both circuit blocks 92 and 96 are required to be included within circuit 68. Circuit 68 will then operate in the first mode and the gate voltage $V_G$ defining the saturation current through transistor 84, which corresponds to the limited level of load current $I_L$ therethrough, is given by equation (1). The values of resistors $R_1$ 98 and $R_2$ 100 can be approximately chosen to provide the gate voltage $V_G$ required to achieve the targeted saturation current through transistor 84.

The second mode of operation of electrical load driving circuit 68 is intended for applications in which the maximum amplitude of input voltage $V_{IN}$ is known and is within a range that can be reduced, in accordance with equation (2), to provide a gate voltage $V_G$ defining the saturation current through transistor 84, which corresponds to the limited level of load current $I_L$ therethrough.

Figure 4:
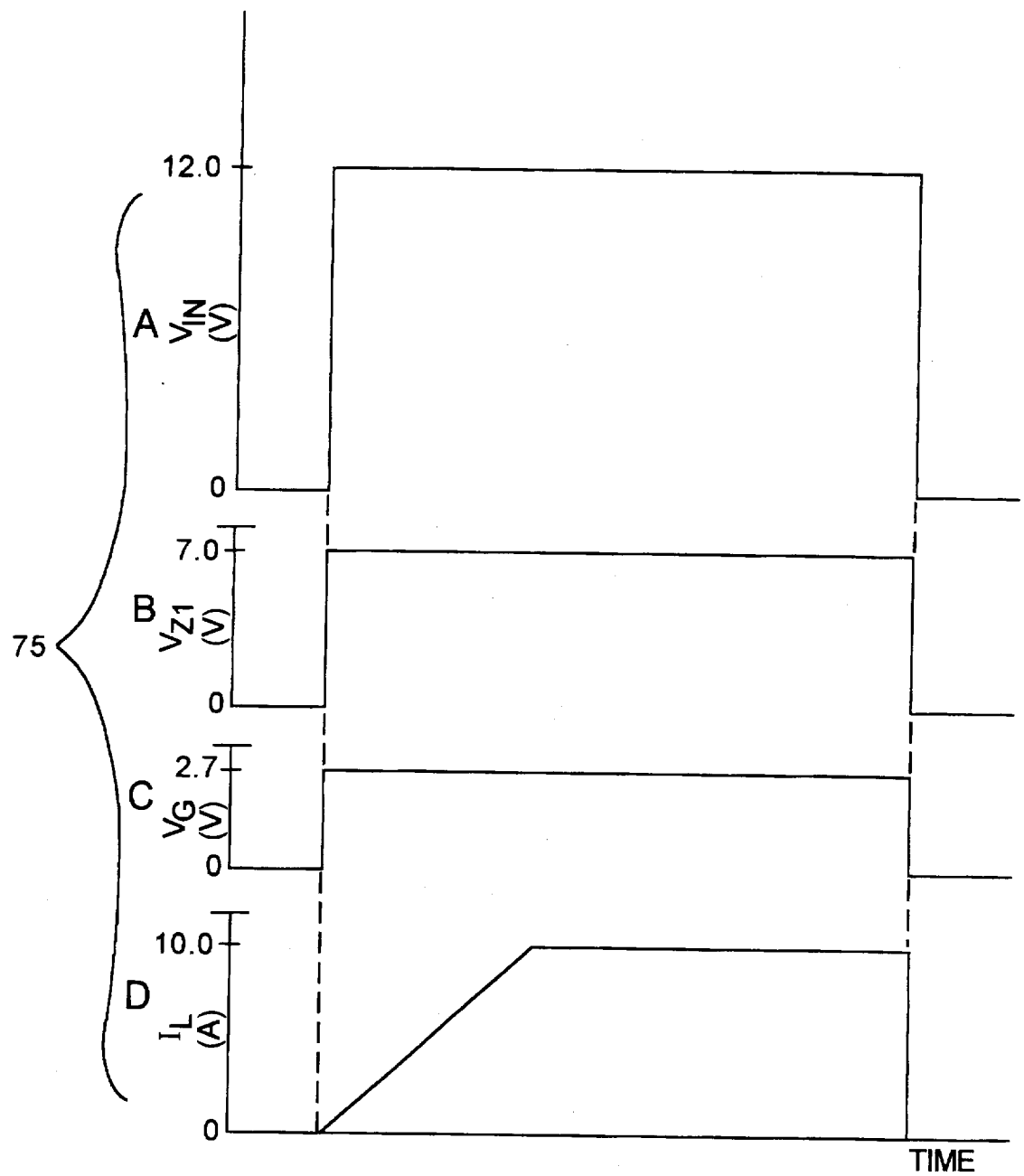
FIG. 4 is a waveform plot illustrating one operational mode of the electrical load driving circuit of the present invention in the system of FIG. 2.

Referring now to FIG. 4, a group of waveforms 75 illustrating the first mode of operation of electrical load driving circuit 68 within system of 50 of FIG. 2 will now be described. It is to be understood, however, that electrical load driving circuit 68 may be used within systems of other configurations to drive other reactive loads. An input drive signal $V_{IN}$ (FIG. 4A) is provided at INPUT 66 of device 68. In the example shown in FIG. 4, $V_{IN}$ is provided by control module 12 and is a rectangular pulse having a maximum amplitude of approximately 12 volts. Zener diode $Z_1$ 94 has an avalanche breakdown voltage of approximately 7 volts, so that the node voltage $V_{Z1}$ (FIG. 4B) is reduced from approximately 12 volts to approximately 7 volts. Preferably, the value of $R_3$ 80 is chosen to be negligible with respect to the values of $R_1$ 98 and $R_2$ 100 and the resistive divider of circuit block 96 is designed, as is known in the art, to provide a gate voltage $V_G$ of approximately 2.7 volts (FIG. 4C). Referring back to FIG. 3, a gate voltage $V_G$ of approximately 2.7 volts, for the IGBT 84 illustrated therein, results in a saturation current level of approximately 10 amperes. The load current $I_L$ is thus shown in FIG. 4D as linearly increasing to a maximum value of approximately 10 amperes. Since the collector current through transistor 84 saturates at approximately 10 amperes, the load current $I_L$ is limited to 10 amperes for the remainder of the $V_{IN}$ pulse. Through appropriate design of circuit blocks 92 and 96, a gate voltage $V_G$ can thus be maintained for any given input voltage $V_{IN}$ which limits the load current $I_L$ therethrough to a desired saturation current level of transistor 84.

Figure 5:
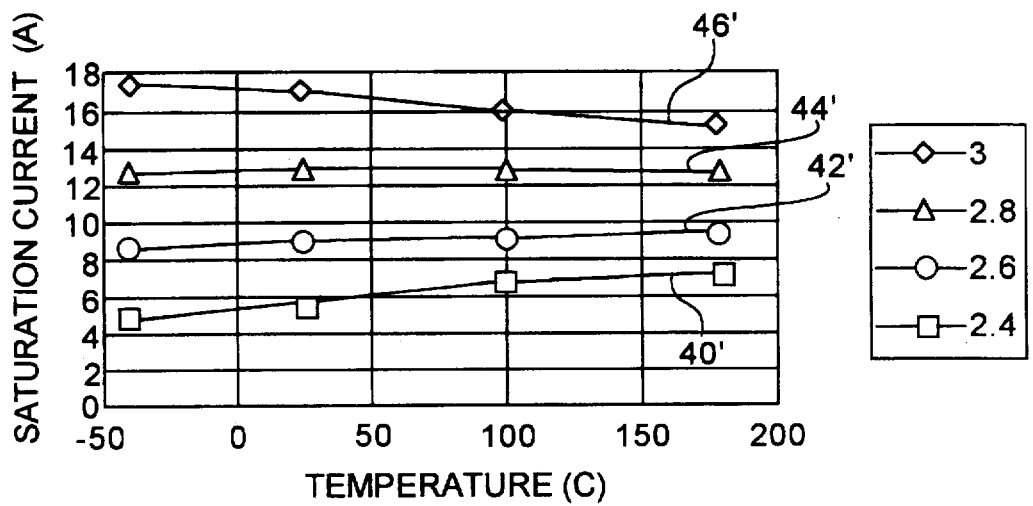
FIG. 5 is a plot of IGBT saturation current versus temperature for a number of different gate drive voltages.

Referring now to FIG. 5, another aspect of the present invention will be described. For the IGBT 84 defined by the plot of FIG. 3, FIG. 5 illustrates a plot of IGBT 84 saturation current versus temperature for a number of different gate drive voltages $V_G$. For a gate drive voltage $V_G$ of approximately 2.4 volts, the IGBT saturation current 40' varies between approximately 4.5–7.5 amperes over an operating temperature range of approximately –40° C. to approximately 175° C. For a gate drive voltage $V_G$ of approximately 2.6 volts, IGBT saturation current 42' varies between approximately 8–10 amperes over the operating temperature range. For a gate drive voltage $V_G$ of approximately 2.8 volts, IGBT saturation current 44' maintains an approximately steady value of 12.5 amperes over the entire operating temperature range. For a gate drive voltage $V_G$ of approximately 3 volts, IGBT saturation current 46' varies between approximately 17.5–15 amperes over the operating temperature range.

As illustrated in FIG. 5 with respect to IGBT 84, a range of saturation currents exist for any given insulated gate transistor, wherein the temperature effect thereon can be considered negligible. For example, the saturation current, $I_{D(SAT)}$, in a MOS transistor is given by the equation:

$$I_{D(SAT)} = \mu_n C_{OX} W (V_{GS} - V_T)^2 / 2L \quad (4),$$

where $\mu_n$ is the channel mobility, $C_{OX}$ is the gate oxide capacitance, W is the device channel width, L is the device channel length, $V_{GS}$ is the gate-to-source voltage, and $V_T$ is the threshold (turn on) voltage. In an IGBT, such as IGBT 84, $V_{GS}$ of equation (4) is replaced by the term $V_{GF}$, which is the gate-to-gate emitter voltage, and the entire equation is multiplied by a gain term, β, to produce the following equation for the collector saturation current $I_{C(SAT)}$:

$$I_{C(SAT)} = \mu_n C_{OX} W \beta (V_{GE} - V_T)^2 / 2L \quad (5).$$

In either of equations (4) or (5), only the terms $\mu_n$ and $V_T$ are affected by temperature. Specifically, both $\mu_n$ and $V_T$ decrease with increasing temperature. The temperature effect on $m_n$ dominates equations (4) and (5) at high saturation currents, so that such high saturation currents $I_{D(SAT)}$ and $I_{C(SAT)}$ have a negative temperature coefficient as illustrated by low saturation current 46' of FIG. 5. Conversely, the temperature effect on $V_T$ dominates equations (4) and (5) at low saturation currents, so that such low saturation currents $I_{D(SAT)}$ and $I_{C(SAT)}$ have a positive temperature coefficient as illustrated by saturation currents 40' and 42' of FIG. 5. Due to these competing effects, there exists a mid-range of saturation currents over which $I_{D(SAT)}$ and $I_{C(SAT)}$ exhibit a negligible temperature coefficient.

For the particular IGBT 84 illustrated in FIG. 5, saturation currents within the range of approximately 10–14 amperes are, for example, substantially temperature independent.

In many load driving applications, such as with the automotive ignition control system 50 of FIG. 2, an insulated gate transistor can thus be chosen and/or designed to provide for substantially temperature independent operation at a desired saturation current level over a wide operating temperature range. For example, in one embodiment of the present invention, a saturation current, $I_{C(SAT)}$ of approximately 10 amperes is desired (see FIG. 4) so that IGBT 84 having the temperature characteristics of FIG. 5 may be used. It is to be understood, however, that alternate embodiments of the present invention may require other saturation current levels. In such cases, the parameters W, L and/or $C_{OX}$ may be chosen in the design of the insulated gate load driving device to place the range of substantially temperature independent saturation currents in the desired operating range. Selection of an appropriate insulated gate drive transistor may thus involve choosing an existing transistor having the desired temperature operating characteristics or designing a transistor of appropriate channel width, channel length and gate capacitance to achieve such desired characteristics. Moreover, if the zener diode $Z_1$ 94 is designed to have an avalanche breakdown voltage that is independent of temperature, as is known in the art, and $R_1$ 98 and $R_2$ 100 are produced from the same materials such that they have the same temperature and process dependence, the electrical load driving circuit 68 illustrated in FIG. 2 may limit load current $I_L$ to an accurate and reproducible level which is substantially independent of temperature and process variations.

Figure 6:
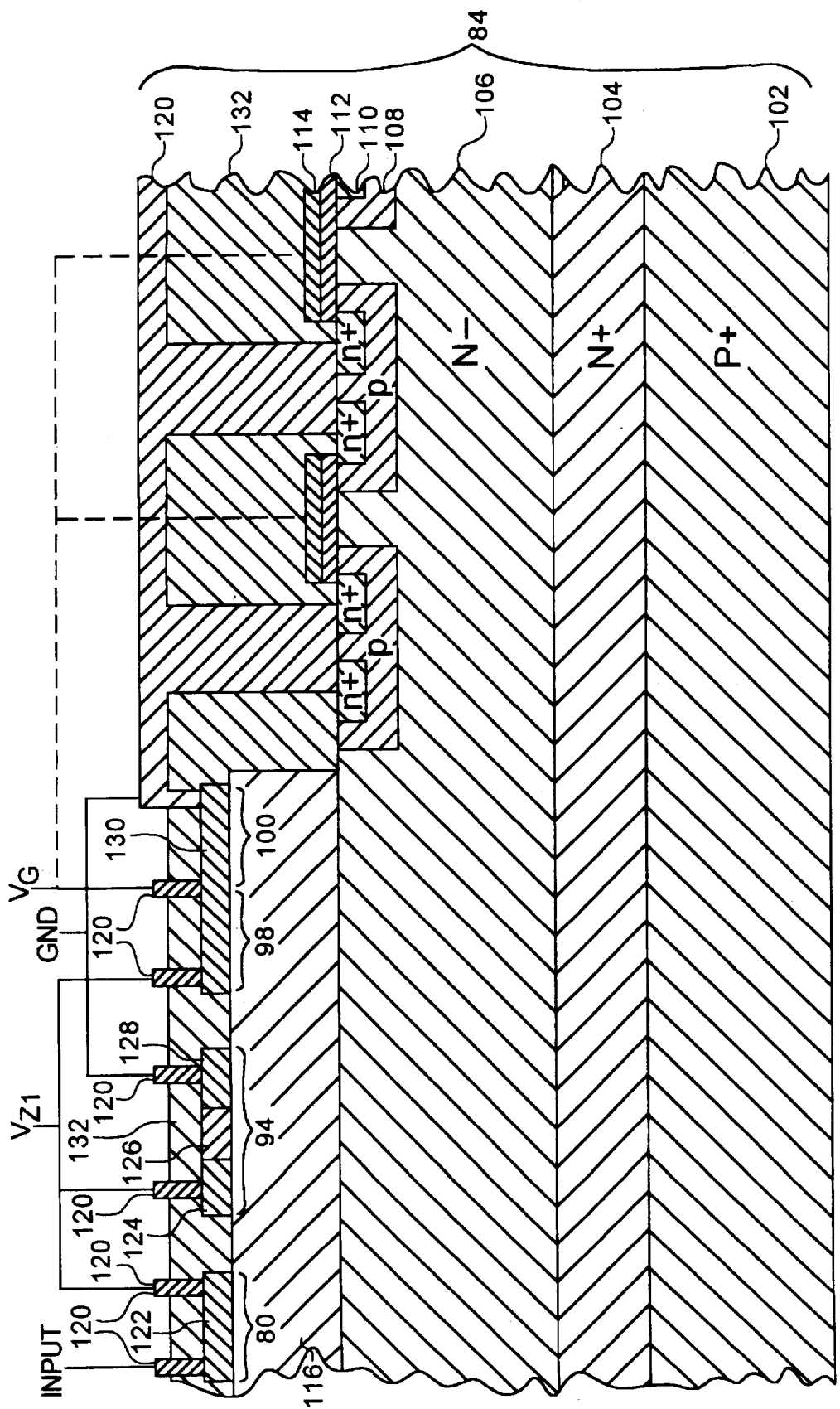
FIG. 6 is a cross-sectional view of a single integrated circuit embodiment of the electrical load driving circuit of the present invention.

Referring now to FIG. 6, a cross-sectional view of a preferred construction of electrical load driving circuit 68, formed of a single integrated circuit, is shown in accordance with yet another aspect of the present invention. Several techniques and structures for forming OV clamp 90 on the same integrated circuit defining insulated gate transistor 84 are known. Details of OV clamp 90 are therefore not shown in FIG. 6 for ease of illustration. As in FIG. 2, insulated gate transistor 84 is illustrated in FIG. 6 as an IGBT. Also for ease of illustration, only a few cells thereof are shown.

Construction of IGBT 84 begins with a P⁺substrate 102 upon which an N⁺buffer layer is either grown or deposited. The P⁺substrate 102 corresponds to the collector 86 of IGBT 84 as shown in FIG. 2. An N⁻epitaxial layer 106 is grown atop N⁺buffer layer 104. An electrical insulation layer 116, preferably made of $SiO_2$, silicon nitride ($Si_3N_4$), polyimide, or the like, is grown, or otherwise deposited, on the N⁻epitaxial layer 106. Electrical insulation layer 116, sometimes referred to as a "field oxide" layer, is selectively removed in areas that will contain active cells of the IGBT 84, and gate oxide 112 is grown or otherwise deposited in these areas. A layer of conductive gate material 114, preferably polysilicon, is deposited, or otherwise grown, on top of the gate oxide layer 112, and layers 112 and 114 are then patterned to form the gate 82 of IGBT 84, as shown in FIG. 2.

A series of equally spaced apart p-wells 108 are diffused or implanted into the N⁻epitaxial layer 106 such that a portion of gate oxide 114 overlaps adjacent p-wells 108. Within each of the p-wells 108, a pair of equally spaced apart n⁺wells 110 are diffused or implanted therein. The p-well 108 and n⁺well 110 pairs thus define a series of IGBT "cells" within the N_epitaxial layer 106. In comparison with FIG. 2, collector 86 of IGBT 84 corresponds to P⁺substrate 102, gate 82 corresponds to gate areas 114, and emitter 88 corresponds to the combination of p-wells 108 and n⁺wells 110. The foregoing IGBT structure has been described as being constructed in accordance with a known self-aligned gate process, although it should be understood that IGBT 84 may be constructed in accordance with any known semiconductor fabrication technique.

On top of electrical insulation layer 116, and therefore completely dielectrically isolated from IGBT 84, zener diode 94 and resistors 80, 98, and 100 are formed.

Preferably, each of the electrical components 80–100 are formed of polysilicon that is grown or otherwise deposited on top of electrical insulation layer 116. As is known in the art, accurately-valued resistors may be formed of polysilicon having known sheet resistivity. Preferably, resistors 98 and 100 are formed from a single pattern of polysilicon 130. Resistor 80 may further be formed from polysilicon sheet 130 but is preferably formed from a separate sheet 122 of polysilicon. In any case, resistors 80, 98, and 100 are preferably formed from either N⁺or P⁻type polysilicon.

Zener diode 94 is preferably formed as a known back-to-back diode having temperature independent operation. A pair of N⁺polysilicon regions 124 and 128 are formed on either side of P⁻polysilicon section 126. A semiconductor junction is formed between polysilicon sections 124 and 126, and between polysilicon sections 126 and 128. Zener diode 94 is thus formed of a reverse biased diode in series with a forward biased diode, which then results in substantially temperature independent operation thereof.

An electrical insulation layer 132, preferably made of $SiO_2$, silicon nitride, polyimide, or the like, is grown or otherwise deposited onto the foregoing layers. Contact holes are then selectively etched or otherwise formed in electrical insulation layer 132, and a metalization layer 120 is provided in selective contact with p-well 108 and n⁺wells 110, and with polysilicon circuit elements 80–100, to provide the interconnections between circuit components described with respect to FIG. 2. It is to be understood that dielectric isolation between IGBT 84 and gate control components 80–100 is preferable regardless of the actual structure of the power transistor (i.e., DMOS, etc.), although not required for operation thereof.

Figure 7:
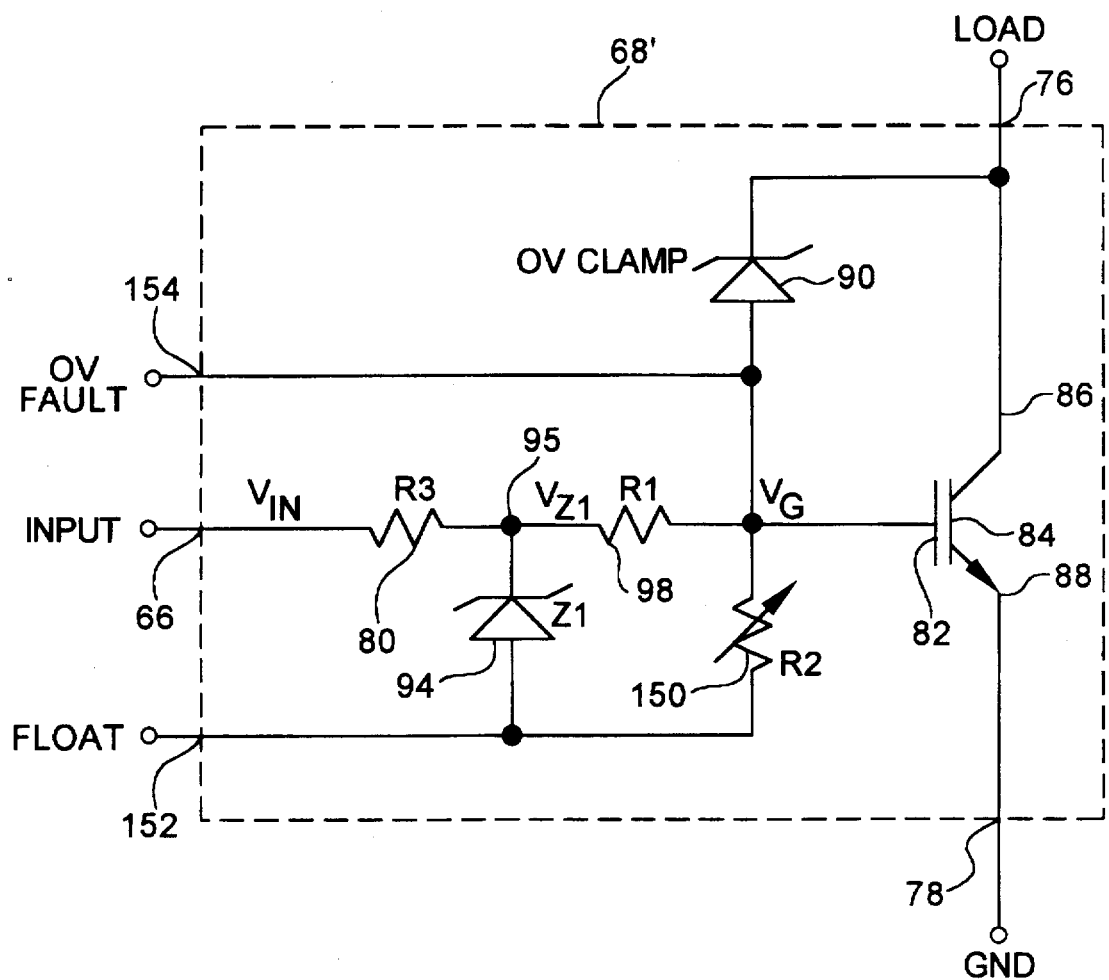
FIG. 7 is a schematic diagram of another embodiment of the electrical load driving circuit of the present invention.

Referring now to FIG. 7, an alternate embodiment 68' of the electrical load driving circuit of the present invention is shown. Electrical load driving circuit 68' is identical in most respects to electrical load driving circuit 68 of FIG. 2, and like elements are therefore referenced with like numbers. However, electrical load driving circuit 68' includes a number of modifications thereto which are intended to provide the device with added operational flexibility and diagnostic capability.

One modification included in the electrical load driving circuit 68' is an OV FAULT terminal 154 connected directly to the gate 82 of transistor 84. The OV FAULT terminal 154 is included to provide for the detection of an over-voltage fault, such as would occur during an inductive flyback condition as previously described. When on over-voltage fault occurs, current flows through the OV clamp 90 and through the input resistance network to ground potential. In many applications, this is the only condition in which the gate voltage $V_G$ is higher than the input voltage $V_{IN}$. By monitoring both $V_{IN}$ and the OV FAULT terminal 154, circuit 68' thus provides for the detection of over-voltage fault conditions.

Another modification included in electrical load driving circuit 68' involves providing resistor $R_2$ 150 as a variable, or programmable, resistor. For example, resistor $R_2$ 150 can be fabricated, as is known in the art, as a network of resistors that can be programmed during wafer test. This feature would permit fine tuning of the gate voltage $V_G$ with respect to $V_{Z1}$ (equation (1)) or to $V_{IN}$ (equation (2)) in order to provide the desired saturation current level of transistor 84. Preferably, resistor $R_2$ 150 is provided as a network of fusibly linked resistors as is known in the art. Typically, such fusible links are selectively opened by electrical means, to incrementally add resistance to the total value of $R_2$ 150. It is to be understood, however, that the present invention contemplates that any known technique for providing a variable resistance on an integrated circuit may be used to provide variable resistor $R_2$ 150.

A further modification included in the electrical load driving circuit 68' is that the common connection of zener diode $Z_1$ 94 and resistor $R_2$ 150 is provided as a FLOAT terminal 152. By providing such a FLOAT terminal 152 rather than connecting zener diode 94 and resistor 150 to the GND terminal 78, circuit 68' permits operation thereof with lower input voltages $V_{IN}$. Specifically, if the FLOAT terminal 152 is unconnected, the input voltage $V_{IN}$ is applied directly (undivided and unclamped) to the gate 82 of transistor 84. A fourth mode of operation is thus provided, which is intended for applications in which the maximum amplitude of the input voltage $V_{IN}$ is equal to the gate voltage $V_G$ required to produce the desired saturation current level in transistor 84. Under any of the three previously described operational modes, the FLOAT terminal 152 is connected to the GND terminal 78.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected. For example, although the electrical load driving device of the present invention is shown and described as being implemented as a so-called low side driver, it is to be understood that circuit 68 or 68' can also be made to operate as a high-side driver, i.e. with the LOAD terminal 76 connected directly to a supply voltage (such as $V_{IGN}$ 56), and the load being connected between the GND terminal 78 and ground potential. Those skilled in the art will recognize that only minor modifications to device 68 and 68' need to be made in order to effectuate such an arrangement. As a second example, although the electrical load driving circuit 68 or 68' of the present invention is preferably provided as a single integrated circuit, those skilled in the art will recognize that circuit blocks 92 and/or 96 may be provided as part of a separate circuit without detracting from the concepts of the present invention. As another example, although resistor $R_2$ 150 is preferably a variable-valued resistor in circuit 68', those skilled in the art will recognize that either one, or both, of resistors $R_1$ 98, and $R_2$ 150 may be variable-valued to provide for post-fabrication adjustment of $V_G$ with respect to either $V_{Z1}$ (equation (1)) or $V_{IN}$ (equation (2)).

The embodiments of the invention in which an exclusive property or privilege is claimed are defined as follows:

1. Circuitry for driving an electrical load comprising:
    a load driving transistor connected to the electrical load and operable to conduct a load current therethrough in response to a drive signal provided to an insulated gate thereof;
    a first resistor having a first end connected to said insulated gate and a second end;
    a second resistor having a first end connected to said insulated gate and a second end adapted to receive said drive signal; and
    a zener diode having a first end connected to said second end of said second resistor and a second end connected to said second end of said first resistor, said resistors and said zener diode limiting said drive signal to a predefined drive signal level to thereby limit said load current to a predefined load current level.

2. The circuitry of claim 1 further including a third resistor having a first end connected to said second end of said second resistor and a second end connected adapted to receive said drive signal.

3. The circuitry of claim 1 wherein one of said first and second resistors is a variable-valued resistor.

4. The circuitry of claim 1 wherein said load driving transistor is an insulated gate bipolar transistor having a collector connected to the load and an emitter, said second ends of said first resistor and said zener diode connected to said emitter.

5. The circuitry of claim 4 further including an over voltage clamp circuit connected between said insulated gate and said collector, said over voltage clamp circuit limiting said collector voltage to a predefined maximum value.

6. The circuitry of claim 5 further including a terminal connected to said insulated gate for monitoring the signal thereat for comparison to said drive signal, the signal at said insulating gate exceeding said drive signal only during activation of said over voltage clamp circuit.

7. The circuitry of claim 1 wherein the load is an inductive load.

8. In combination:
    an integrated circuit defining an insulated gate transistor operable to conduct current therethrough in response to a drive signal provided to the insulated gate; and
    gate drive circuitry for limiting the drive signal to a predefined drive signal level, the predefined drive signal level limiting the current through the transistor to a predefined current level, the gate drive circuitry comprising:
    an electrical insulation layer formed over the insulated gate transistor; and
    an electrical clamping component formed over said electrical insulation layer and in electrical contact with the insulated gate, said electrical clamping component clamping the drive signal at the predefined drive signal level if the drive signal exceeds the predefined drive signal level.

9. The combination of claim 8 wherein said electrical clamping component includes a zener diode connected to the insulated gate, said zener diode operable to clamp the drive signal at the predefined drive signal level if the drive signal exceeds the predefined drive signal level.

10. The combination of claim 8 wherein said electrical clamping component includes:
    a first resistor having a first end connected to the insulated gate and a second end; and
    a second resistor having a first end connected to the insulated gate and a second end connected to a source of the drive signal, said first and second resistors defining a resistor divider network.

11. The combination of claim 10 wherein said electrical clamping component further includes a zener diode having a first end connected to said second end of said second resistor and a second end connected to said second end of said first resistor.

12. The combination of claim 11 further including a third resistor having a first end connected to said second end of said second resistor and a second end connected to said source of the drive signal.

13. The combination of claim 11 wherein said second resistor is a variable-valued resistor.

14. The combination of claim 11 wherein the insulated gate transistor is an insulated gate bipolar transistor having a collector connected to a load and an emitter, said second ends of said first resistor and said zener diode connected to said emitter.

15. The circuitry of claim 14 further including an over voltage clamp circuit connected between the insulated gate and said collector, said over voltage clamp circuit limiting collector voltage to a predefined maximum value.

16. A method of operating an insulated gate transistor comprising the steps of:

selecting the transistor to have a desired range of saturation currents associated therewith that are substantially constant over an operating temperature range of the transistor;

providing an excitation signal to the insulated gate of the selected transistor sufficient to cause the transistor to conduct a saturation current therethrough in excess of the desired range of substantially constant saturation currents; and limiting the excitation signal to a predefined signal level corresponding to that which causes the transistor to conduct a saturation current therethrough within the desired range of substantially constant saturation currents.

17. The method of claim 16 wherein the insulated gate transistor is an insulated gate bipolar transistor.

* * * * *